US006770569B2

(12) United States Patent
Foerstner et al.

(10) Patent No.: US 6,770,569 B2
(45) Date of Patent: Aug. 3, 2004

(54) LOW TEMPERATURE PLASMA SI OR SIGE FOR MEMS APPLICATIONS

(75) Inventors: Juergen A. Foerstner, Mesa, AZ (US); Steven M. Smith, Gilbert, AZ (US); Raymond Mervin Roop, Scottsdale, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 53 days.

(21) Appl. No.: 10/210,315

(22) Filed: Aug. 1, 2002

(65) Prior Publication Data

US 2004/0023429 A1 Feb. 5, 2004

(51) Int. Cl.[7] .............................................. H01L 21/31
(52) U.S. Cl. ..................................................... 438/758
(58) Field of Search .............................. 438/106, 117, 438/758, 767

(56) References Cited

U.S. PATENT DOCUMENTS

| | | | |
|---|---|---|---|
| 5,552,994 | A | 9/1996 | Cannon et al. |
| 5,578,976 | A | 11/1996 | Yao |
| 5,616,514 | A | 4/1997 | Muchow et al. |
| 6,051,866 | A | 4/2000 | Shaw et al. |
| 6,069,540 | A | 5/2000 | Berenz et al. |
| 6,635,506 | B2 * | 10/2003 | Volant et al. .................. 438/52 |
| 6,701,779 | B2 * | 3/2004 | Volant et al. .................. 73/105 |

FOREIGN PATENT DOCUMENTS

WO    WO 96/16203    5/1996

OTHER PUBLICATIONS

Tom Campbell, "MEMS Switch Technology Approaches the "Ideal Switch", " Applied Microwave & Wireless, Dow–Key Microwave Corp., pp. 101–107.
L. Pavesi et al., "Optical Gain in Silicon Nanocrystals," Proceedings of SPIE vol. 4293 (2001), pp. 162–172.

Hoa T.M. Pham et al., "Evaluation of In–situ Doped PECVD SiC Thin Films for Surface Micromachining," Delft University of Technology, Netherlands, pp. 856–860.
Andrea Borgioli et al., "Low–Loss Distributed MEMS Phase Shifter," IEEE Microwave and Guided Wave Letters, vol. 10, No. 1, Jan. 2000, pp. 7–9.
S. Chowdhury et al., "A Surface Mountable MEMS Beam-forming Microphone Array and Associated MEMS Socket Structure," Symposium on Microelectronics Research & Development in Canada, Ottawa, Jun. 7, 2001, 20 pages.
R. Ghodssi et al., "Thick Buried Oxide In Silicon (TBOS): An Integrated Fabrication Technology For Multi–Stack Wafer–Bonded MEMS Processes," 10th International Conference on Solid–State Sensors and Actuators, Sendai, Japan, Jun. 7–10, 1999, pp. 1–4.
Veljko Milanovi et al., "Convection–based Accelerometer and Tilt Sensor Implemented in Standard CMOS," International Mechanical Engineering Conference and Exposition, MEMS Symoisa, Anaheim, CA, Nov. 18, 1998, 4 pages.
Michael Gaitan et al., "Micromachined Passive Microwave Elements for Effective Isotropic Radiated Power Sensor," MEMS Interface Circuits Workshop, Oct. 14, 1999, 24 pages.
Dr. Michael Gaitan, CMOS Foundry MEMS, ENEE 719R: Design and Fabrication of Micro–Electro–Mechanical Systems (MEMS), University of Maryland, Nov. 22, 2000, 54 pages.

* cited by examiner

Primary Examiner—Kamand Cuneo
Assistant Examiner—Scott B. Geyer
(74) Attorney, Agent, or Firm—Hulsey Grether & Fortkort LLP; John A. Fortkort

(57) ABSTRACT

A method is provided for making a MEMS structure (69). In accordance with the method, a CMOS substrate (51) is provided which has interconnect metal (53) deposited thereon. A MEMS structure is created on the substrate through the plasma assisted chemical vapor deposition (PACVD) of a material selected from the group consisting of silicon and silicon-germanium alloys. The low deposition temperatures attendant to the use of PACVD allow these materials to be used for MEMS fabrication at the back end of an integrated CMOS process.

30 Claims, 5 Drawing Sheets

FIG. 18

LOW TEMPERATURE PLASMA SI OR SIGE FOR MEMS APPLICATIONS

FIELD OF THE INVENTION

The present invention relates generally to MEMS devices, and more particularly to low temperature methods for making MEMS devices out of silicon and silicon-germanium alloys.

BACKGROUND OF THE INVENTION

Advancements in micromachining and other microfabrication techniques and processes have enabled the fabrication of a wide variety of MicroElectroMechanical Systems (MEMS) and devices. These include moving rotors, gears, switches, accelerometers, miniaturized sensors, actuator systems, and other such structures.

One important application of microfabrication is in the fabrication of RF MEMS switches. Such devices have several advantages over their solid state counterparts. For example, RF MEMS switches provide lower insertion loss, higher isolation, better linearity, and lower power than solid state switches. RF MEMS devices are also useful in a variety of applications. Thus, they can be used as tunable preselectors and frequency synthesizers, and are also useful as components in a variety of telecommunications devices and systems, including signal routing devices, impedance matching networks, and adjustable gain amplifiers.

Figure 1:
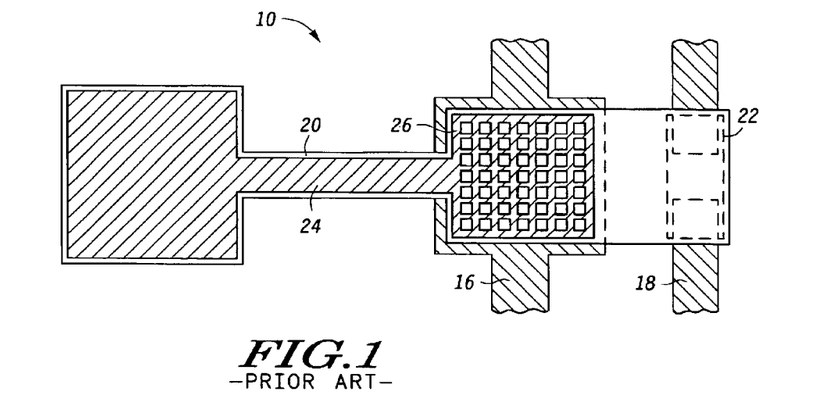
FIG. 1 is a top view of a prior art RF MEMS.
Figure 2:
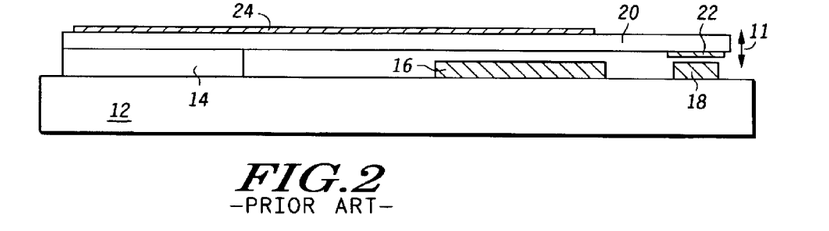
FIG. 2 is a side view of a prior art RF MEMS.

FIG. 1 and FIG. 2 (the later of which is a side view of FIG. 1) depict a conventional RF MEMS switch 10. The switch includes a cantilevered arm 20 which typically comprises an insulating material and which is attached to the substrate 12 by an anchor structure 14. The anchor structure may be formed as a mesa on the substrate by deposition buildup or through the selective removal or etching away of surrounding material. A bottom electrode 16, which is typically grounded, and a signal line 18 are also formed on the substrate. The bottom electrode and signal line typically comprise strips of a metal that is not easily oxidized, such as gold. A gap exists between the signal line and the bottom electrode.

The actuating part of the switch comprises the cantilevered arm 20 noted above. The cantilevered arm forms a suspended microbeam which is attached at one end to the top of the anchor structure and which extends over and above the bottom electrode and the signal line disposed on the substrate. An electrical contact 22, which also typically comprises a metal such as gold that does not oxidize easily, is formed on the end of the cantilever arm that is removed from the anchor structure. The electrical contact is positioned on the bottom side of the cantilever arm so as to face the top of the substrate over and above the signal line.

A top electrode 24, typically comprising a metal such as aluminum or gold, is formed atop the cantilever arm. The top electrode starts above the anchor structure and extends along the top of the cantilevered arm to end at a position above the bottom electrode. The cantilevered arm and top electrode are broadened above the bottom electrode (which is itself broadened) to form a capacitor structure 26. The capacitor structure is provided with a grid of holes to reduce its mass.

In operation, the switch is normally in an "Off" position as shown in FIG. 2. With the switch in the off-state, the signal line is an open circuit due to the gap between the electrical contact and the signal line. The switch is actuated to the "On" position by application of a voltage on the top electrode. With a voltage on the top electrode, electrostatic forces attract the capacitor structure (and cantilever arm) toward the bottom electrode. Actuation of the cantilevered arm toward the bottom electrode, as indicated by arrow 11, causes the electrical contact to move against the signal line, thereby closing the gap and placing the signal line into the on-state (i.e., closing the circuit).

One problem encountered in devices of the type depicted in FIGS. 1 and 2 relates to the mismatch in coefficients of thermal expansion (CTEs) between the materials used for certain components of the device. In particular, in the case of RF MEMS switches, a thermal mismatch typically exists between the top electrode (which, as noted above, is typically made out of a metal such as Au) and the cantilevered arm (which is usually made out of a material such as silicon oxynitride (SiON)). As a result, the movable portion of the switch tends to become permanently distorted during the thermal cycles that occur after release and during the packaging process, thus leading to changes in the operating characteristics of the switch and, in many cases, switch failure.

A variety of other materials have been used in MEMS fabrication processes, some of which have CTEs that more closely match the CTE of SiON. However, the use of many of these materials in the top electrode of an RF MEMS switch has been precluded by the processing considerations attendant to conventional fabrication methodologies. Thus, for example, silicon and silicon/germanium alloys have been used as structural elements in MEMS processes using LPCVD, and have a number of desirable properties. However, the maximum processing temperature for a typical RF MEMS switch is limited to about 350° C. (due primarily to the presence of the sacrificial layer, which is typically made out of a polyimide or a similar thermally sensitive material), which is well below the deposition temperatures of about 550° C. that are required for silicon or silicon-germanium alloys in an LPCVD or epitaxial process.

Processing temperature considerations have likewise precluded the use of materials such as silicon and silicon/germanium alloys in other MEMS applications, in spite of the desirable physical and electrical properties that these materials have. Such applications include, for example, the fabrication of MEMS devices integrated with CMOS (Complimentary Metal Oxide Semiconductor) structures such as sensors and actuators. CMOS structures are very effective device configurations for the implementation of digital functions, due to their low power consumption and dissipation and the minimization of their current in the off-state. With commercial CMOS-compatible micromachining, microstructures and support circuitry can coexist on the same substrate, and thus can be fabricated in an integrated process.

However, in order to ensure proper integration into a CMOS process and good portability between generations of CMOS, it is preferable to integrate MEMS fabrication into the backend of a CMOS process. This requires formation of the MEMS structures after the interconnect metal has already been deposited. However, the presence of the interconnect metal on the substrate requires that the substrate not be exposed to temperatures in excess of 450° C.; these temperatures are again well below the deposition temperatures of about 550° C. that are required for silicon or silicon-germanium alloys in an LPCVD or epitaxial process. Hence, the use of these materials in backend processing of a CMOS device is precluded. Although it may be possible in some process flows to circumvent this problem by integrating the MEMS fabrication into the beginning or middle of a CMOS process, this is undesirable in that it limits the portability of the process between generations of CMOS.

There is thus a need in the art for a low temperature method for making MEMS devices or components thereof out of silicon or silicon/germanium alloys. There is also a need in the art for a method of fabricating MEMS structures or components based on these materials which can be integrated into the backend of a CMOS process, and which can be used to fabricate sensors and actuators. There is further a need in the art for an RF MEMS device, and a method for making the same, in which the CTE of the top electrode and cantilevered arm are closely matched. These and other needs are met by the devices and methodologies disclosed herein.

SUMMARY OF THE INVENTION

In one aspect, a method for making a MEMS device is provided herein. In accordance with the method, a substrate is provided, and a MEMS structure or component thereof is created on the substrate through the Plasma Assisted Chemical Vapor Deposition (PACVD) of a material selected from the group consisting of silicon and silicon-germanium alloys. The low temperatures attendant to PACVD allow these materials to be used in fabrication processes where their use would have previously been precluded by processing considerations, and also allows these materials to be doped in situ. In accordance with this method, PACVD may be used to fabricate MEMS structures (or components thereof) on a variety of substrates and in a variety of applications. Thus, for example, PACVD may be used to fabricate MEMS structures on CMOS substrates (in which case the MEMS structure could be, for example, a sensor or actuator). PACVD may also be used to fabricate MEMS structures or components (including, for example, electrode and structural elements) in an RF MEMS fabrication process.

In another aspect, a method for making a MEMS structure is provided. In accordance with the method, a CMOS substrate is provided having interconnect metal deposited thereon. The interconnect metal may comprise, for example, gold or aluminum. A MEMS structure or component thereof is created on the substrate through the plasma assisted chemical vapor deposition of a material selected from the group consisting of silicon and silicon-germanium alloys. The plasma assisted chemical vapor deposition typically occurs at a temperature of less than about 450° C., preferably less than about 400° C., more preferably less than about 350° C., even more preferably less than about 300° C., and most preferably less than about 250° C. If desired, the material may be doped as it is deposited.

In still another aspect, a method for manufacturing microelectromechanical sensors and actuators is provided herein. In accordance with the method, a CMOS substrate is provided having at least a first surface region thereon comprising a first material selected from the group consisting of silicon, glass and gallium arsenide, and at least a second surface region thereon comprising a second material selected from the group consisting of silicon oxide and polyimide. A layer of a third material is formed over the substrate which extends over at least a portion of the first and second regions, wherein the third material is selected from the group consisting of silicon and silicon-germanium alloys, and wherein the layer of the third material is formed at a temperature of less than about 450° C., more preferably less than about 350° C., even more preferably less than about 300° C., and most preferably less than about 250° C. through a plasma assisted chemical vapor deposition process. At least a portion of the second material is removed from underneath the layer of the third material so as to form a micromechanical deflection element comprising the third material.

In yet another aspect, a method is provided herein for making an RF MEMS switch. In accordance with the method, a substrate is provided having a signal line or other circuitry defined thereon for supporting an RF MEMS switch. A sacrificial layer is applied to at least a portion of the substrate. A structural element of an RF MEMS switch is then formed over the sacrificial layer, and a top electrode is formed on the structural element through the use of a plasma assisted chemical vapor deposition process. The top electrode is formed at a temperature that is typically less than about 400° C., more preferably less than about 350° C., even more preferably less than about 300° C., and most preferably less than about 250° C. The top electrode comprises a material selected from the group consisting of silicon and silicon-germanium alloys. At least a portion of the sacrificial layer is then removed from underneath the structural element so as to release the element.

In another aspect, an RF MEMS switch is provided which has an electrode comprising a material selected from the group consisting of silicon and silicon/germanium alloys. The switch preferably comprises a cantilevered arm, and the electrode is preferably disposed on the top of the cantilevered arm. A second electrode is preferably disposed below the cantilevered arm.

In still another aspect, devices are disclosed which may be made using the above noted methodologies.

These and other aspects are described in further detail below.

DETAILED DESCRIPTION

Chemical Vapor Deposition (CVD) has been widely used in the art to generate films, coatings, and structures from gaseous precursors. Several different species of CVD are currently known, including, for example, Low Pressure Chemical Vapor Deposition (LPCVD).

One type of CVD that has been developed fairly recently is Plasma Assisted Chemical Vapor Deposition (PACVD), which is also referred to as Plasma Enhanced Chemical Vapor Deposition (PECVD). In PACVD, the energy for inducing the reaction in the precursor that generates the coating material comes from the collision of plasma ions and electrons with the precursor. The plasma itself is typically created through the use of microwaves or electric fields. Since PACVD does not rely on thermally induced reactions in the precursor, the temperature experienced by a substrate in a PACVD process is often lower than the deposition temperatures experienced by a substrate in other commonly used deposition processes such as LPCVD or epitaxy.

It has now been found that PACVD can be successfully used in a MEMS fabrication process for silicon or silicon/germanium alloys to substantially lower the temperature experienced by the substrate in such a process. In particular, PACVD may be used to deposit silicon and silicon/germanium alloys at temperatures in the range of 200–300° C., as compared to the deposition temperatures of about 550° C. that are typically required for these materials in a MEMS fabrication process based on LPCVD or epitaxy. This has allowed MEMS devices, and components thereof (including anchor portions, microbeams, cantilevered arms and other MEMS structures and components), which are based on silicon and silicon/germanium alloys to be formed on a variety of substrates that are incompatible with conventional fabrication methodologies (such as LPCVD or epitaxial processes) due to temperature restrictions. Thus, for example, PACVD may be used to form electrodes (including top electrodes) on RF MEMS switches. PACVD may also be used to form accelerometers, pressure sensors, and components of these devices on CMOS substrates, where the low temperatures it affords permits its use in the backend of an integrated process.

Figure 3:
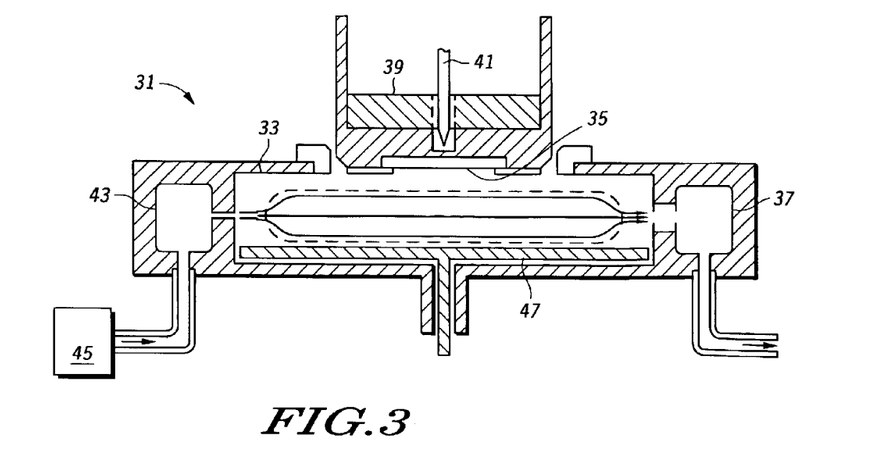
FIG. 3 is an illustration of a PACVD reactor suitable for use in the practice of the methodologies described herein.

A PACVD reactor suitable for use in the fabrication of MEMS structures and components in accordance with the teachings herein is depicted in FIG. 3. As shown therein, the reactor 31 consists of a reaction chamber 33 within which a substrate 35 may be mounted. The reaction chamber is maintained in a near vacuum state by a pump 37. The substrate may be maintained at a suitable deposition temperature within the reaction chamber through the use of a substrate heater 39. The temperature of the substrate is monitored by means of a thermocouple 41. In the applications described herein, the substrate will typically be maintained at a temperature of less than about 450° C., more preferably less than about 350° C., even more preferably less than about 300° C., and most preferably less than about 250° C.

The PACVD reactor relies on the decomposition of precursor gases to achieve deposition of materials onto a substrate. For example, silane ($SiH_4$) may be used as a precursor gas in the deposition of silicon. The precursor gases are supplied to a gas reservoir 43 which is in open communication with the reaction chamber. The flow of the precursor gases into the gas reservoir is regulated by a gas manifold 45. As the precursor gases flow into the reaction chamber, they react with a plasma generated by an RF electrode 47 and undergo decomposition reactions to yield silicon and other solid reaction byproducts that are deposited onto the surface of the substrate as a film.

In addition to the low deposition temperatures it affords, another significant advantage PACVD offers over other deposition methodologies in the context of MEMS fabrication is that doping can be conducted in situ, that is, the material may be doped as it is deposited. This may be accomplished by incorporating a suitable gas into the gas feed stream of the PACVD that can undergo a decomposition reaction in the deposition chamber to yield a suitable dopant. Thus, for example, phosphine ($PH_3$) may be introduced into the feed stream where n-doping is desired, and diborane ($B_2H_6$) may be introduced where p-doping is desired. These gases undergo decomposition to yield elementary phosphorous and boron, respectively, which are then incorporated into the layer being formed. By contrast, conventional approaches often require doping of a layer or structure after the layer or structure has been formed. Such post-deposition doping can damage the substrate, and may also result in undesirable doping gradients.

Once the dopant is incorporated into the structural material, it may be activated by various means. Some degree of doping activation will occur during the PACVD process itself. However, total activation may be achieved by various other means. Laser annealing is a particularly desirable method for total dopant activation, since it can be achieved without exposing the substrate to high temperatures.

FIGS. 4–15 illustrate one possible fabrication sequence by which an RF MEMS in accordance with the teachings herein can be made. Though the structure made by this process differs in design from the prior art structure shown in FIGS. 1 and 2, it will be appreciated that the same general methodology could also be used to produce a structure similar to that depicted in FIGS. 1 and 2 but in which the top metal electrode is replaced with a silicon electrode.

Figure 4:
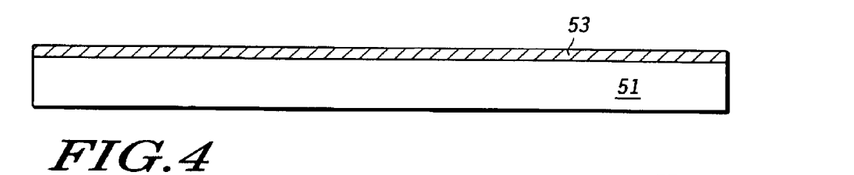
FIGS. 4–15 are cross-sectional illustrations of one possible method for making an RF MEMS in accordance with the teachings herein.
Figure 5:
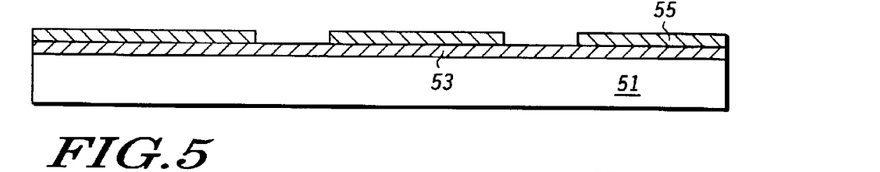
Figure 6:
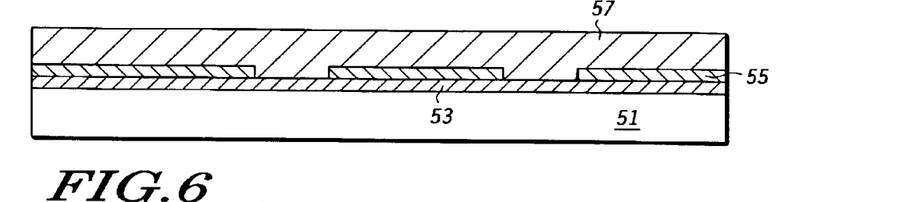
Figure 7:
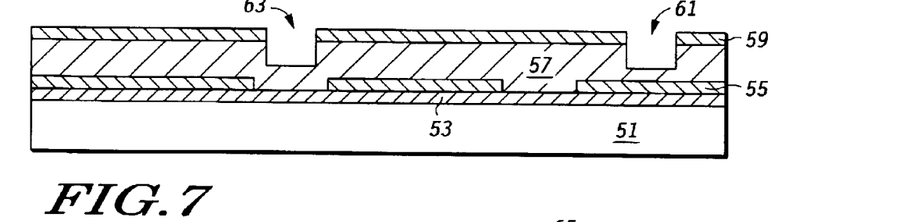

As shown in FIG. 4, a substrate 51 is provided which may comprise a material such as high resistivity silicon, silicon oxide, or GaAs. A layer 53 of $SiO_2$ is disposed on the substrate by, e.g., thermal oxidation, typically to a thickness of about 0.8 microns. As shown in FIG. 5, metallization 55 for supporting the RF MEMS switch (e.g., for signal input/output and/or for grounding purposes) is then defined on the silicon oxide layer by forming a first photo mask (not shown) over the silicon oxide layer, followed by evaporation and liftoff. A polyimide spacer 57 is then formed as shown in FIG. 6.

Next, a first SiON etch mask 59 is formed over the polyimide layer by PACVD, followed by formation of a second photo mask (not shown) for defining recesses in the structure. A contact recess 61 and a contact post recess 63 are then partially etched through the sacrificial material into the structure, followed by removal of the recess mask to yield the structure shown in FIG. 7.

Figure 8:
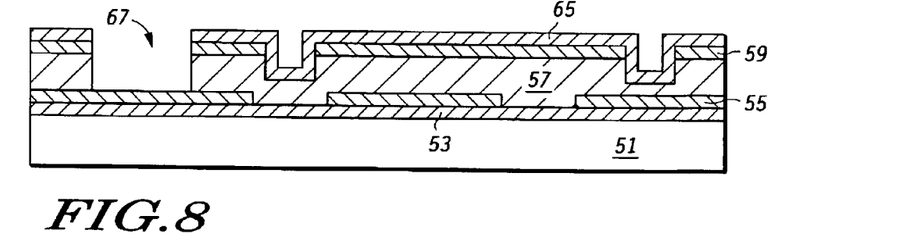
Figure 9:
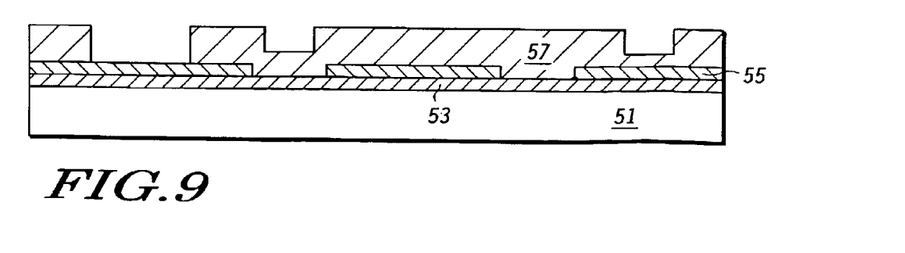

As shown in FIG. 8, a second SiON etch mask 65 is formed over the first SiON etch mask by PACVD. A third photo mask (not shown) is formed over the structure, and suitable etching techniques are used to define an anchor via recess 67 in the structure by etching completely through layer 57. The first and second SiON masks are then removed from the structure as shown in FIG. 9.

Figure 10:
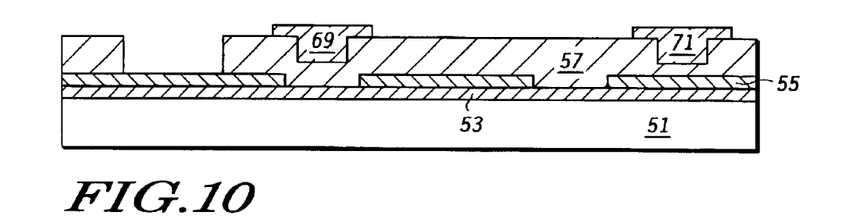
Figure 11:
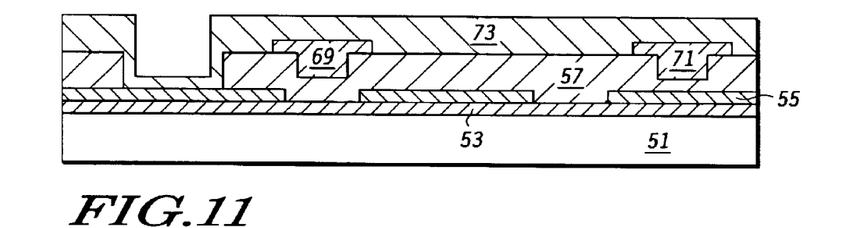
Figure 12:
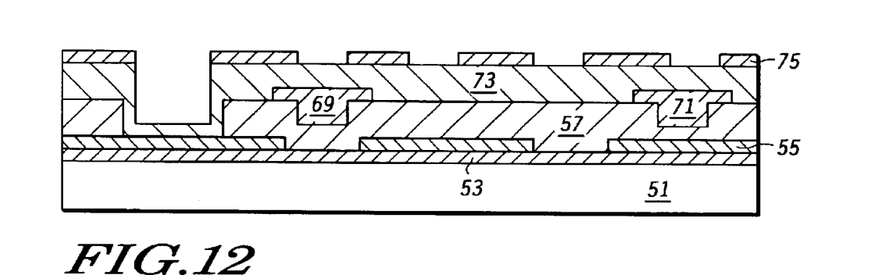

As shown in FIG. 10, a travel stop 69 and shorting bar 71 are formed in the contact and contact post recesses, respectively, which were previously defined in the structure through formation of a fourth photo mask (not shown), followed by evaporation and lift-off. As shown in FIG. 11, the portion or layer giving rise to the cantilever portion 73 of the device is then formed out of low stress SiON by PACVD. As shown in FIG. 12, the patterned top electrode 75, which may comprise, for example, silicon or a silicon/germanium alloy, is then formed on the cantilevered arm by formation of a fifth photo mask (not shown), followed by evaporation and lift-off. The use of PACVD to form the top electrode is advantageous here not only because of the low temperatures it affords, but because the silicon or silicon/germanium alloy may be advantageously doped in-situ.

Figure 13:
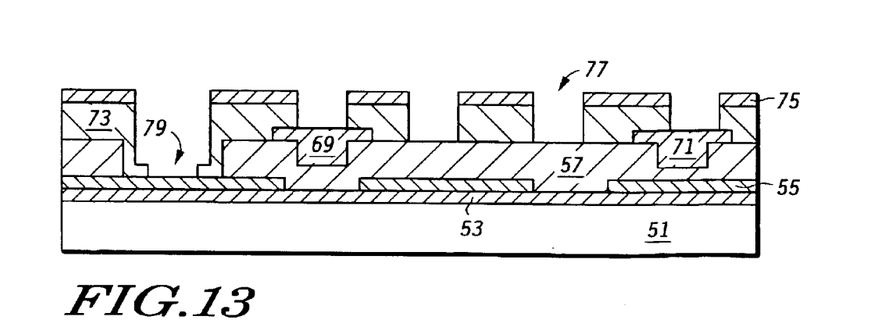

As shown in FIG. 13, a number of etch holes 77 are formed in the SiON layer through the use of a sixth photo mask (not shown), or a selective etch, followed by etching. An aperture 79 is defined in the bottom of the anchor via recess in a similar manner to expose the underlying metallization.

Figure 14:
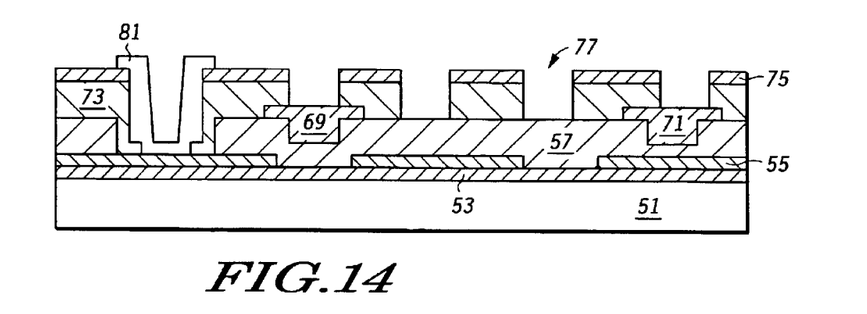
Figure 15:
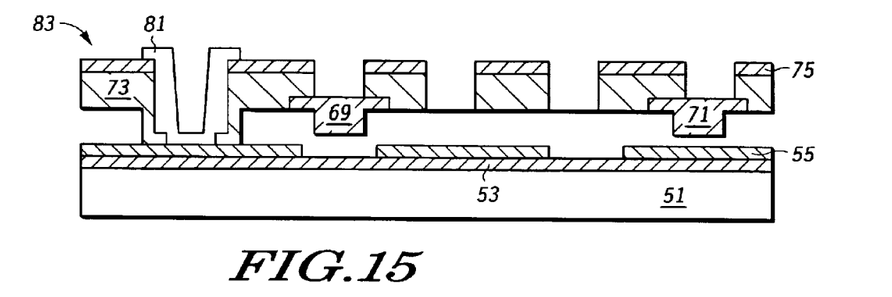

As shown in FIG. 14, an anchor pad 81 is formed in the anchor via recess by formation of a seventh photo mask (not shown), followed by evaporation and lift-off. The resulting anchor pad forms an electrical connection between the top electrode 75 and the bond pads 55. The final structure 83 is then released by chemical removal of the polyimide layer 57, as shown in FIG. 15.

The parameters of the PACVD process used to create silicon or silicon-germanium films in accordance with the teachings herein may be manipulated to modify the crystallinity of the resulting film. For example, pulsed gas technologies may be employed to produce nano-crystalline PACVD silicon films for use in RF MEMS and various other MEMS devices. Such nano-crystalline films may be particularly advantageous in some processes for in situ doping to produce films having a lower resistivity.

The devices and methodologies described herein may be further understood with reference to the following non-limiting examples.

EXAMPLES 1–42

These examples illustrate the use of PACVD to achieve the low temperature deposition of silicon on a substrate.

A series of silicon wafer substrates were placed in the reaction chamber of a Novellus Concept One Plasma Enhanced Chemical Vapor Deposition System (available commercially from Novellus Systems, Inc., San Jose, Calif.). The system was equipped with a vacuum pump and gas inlets adapted to provide a steady flow of silane as the precursor and helium as a carrier gas. The system was also equipped with a temperature control mechanism to maintain a steady temperature in the reaction chamber, and a microwave source having an adjustable power output. The flow rates of the precursor and carrier gases, the wattage of the microwave source, and the temperature and pressure of the reaction chamber for each experiment are indicated in TABLE 1.

TABLE 1

PLASMA SILICON DEPOSITION DATA

| EXAMPLE | He Flow (SLM) | SiH4 Flow (SLM) | HFRF (Watts) | Temp. (° C.) | Deposition Time | Pressure (Torr) | Thickness (Å) | Dep. Rate (ang/min) | Stress ($e^9$ Dynes/cm$^2$) | Si—H Bonds ($e^{21}$ At/cc) |
|---|---|---|---|---|---|---|---|---|---|---|
| 1 | 2 | 0.2 | 200 | 250 | 500 | 2 | 2456 | 295 | −5.12 | No Data |
| 2 | 2 | 0.5 | 400 | 250 | 180 | 2 | 2079 | 693 | −0.86 | No Data |
| 3 | 4 | 0.5 | 200 | 250 | 500 | 2 | 1895 | 227 | −6.64 | No Data |
| 4 | 2 | 0.5 | 200 | 250 | 500 | 2 | 1878 | 225 | 0.16 | No Data |
| 5 | 2 | 0.2 | 400 | 250 | 700 | 2 | 2111 | 181 | −0.60 | No Data |
| 6 | 4 | 0.2 | 200 | 250 | 500 | 2 | 1951 | 234 | −9.76 | No Data |
| 7 | 2 | 0.2 | 200 | 300 | 500 | 2 | 2391 | 287 | −5.98 | 8.08 |
| 8 | 2 | 0.5 | 400 | 300 | 180 | 2 | 2252 | 751 | −3.50 | 9.84 |
| 9 | 4 | 0.5 | 200 | 300 | 500 | 2 | 2757 | 331 | −5.31 | 6.86 |
| 10 | 2 | 0.5 | 200 | 300 | 500 | 2 | 2283 | 274 | −2.56 | 7.86 |
| 11 | 2 | 0.2 | 400 | 300 | 700 | 2 | 1965 | 168 | −7.39 | 11.60 |
| 12 | 4 | 0.2 | 200 | 300 | 500 | 2 | 3522 | 423 | −5.84 | 6.64 |
| 13 | 2 | 0.2 | 200 | 350 | 500 | 2 | 1674 | 201 | −9.83 | 9.09 |
| 14 | 2 | 0.5 | 400 | 350 | 180 | 2 | 1961 | 654 | −4.45 | 7.62 |
| 15 | 4 | 0.5 | 200 | 350 | 500 | 2 | 2785 | 334 | −5.87 | 6.15 |
| 16 | 2 | 0.5 | 200 | 350 | 500 | 2 | 2121 | 255 | −4.11 | 7.05 |
| 17 | 2 | 0.2 | 400 | 350 | 700 | 2 | 1960 | 168 | −8.09 | 9.30 |
| 18 | 4 | 0.2 | 200 | 350 | 500 | 2 | 2004 | 240 | −10.30 | 9.57 |
| 19 | 2 | 0.2 | 200 | 350 | 654 | 1.5 | 2141 | 197 | −10.60 | 7.75 |
| 20 | 2 | 0.5 | 400 | 350 | 300 | 1.5 | 2109 | 422 | −9.56 | 9.61 |
| 21 | 4 | 0.5 | 200 | 350 | 538 | 1.5 | 2077 | 232 | −9.66 | 8.97 |
| 22 | 2 | 0.5 | 200 | 350 | 370 | 1.5 | 2020 | 328 | −7.74 | 7.34 |
| 23 | 2 | 0.2 | 400 | 350 | 483 | 1.5 | 2144 | 266 | No Data | 9.64 |
| 24 | 4 | 0.2 | 200 | 350 | 747 | 1.5 | 2014 | 162 | −12.00 | 10.1 |
| 25 | 2 | 0.2 | 200 | 350 | 474 | 2.5 | 1975 | 250 | −8.11 | 7.57 |
| 26 | 2 | 0.5 | 400 | 350 | 114 | 2.5 | 1884 | 992 | No Data | 8.59 |
| 27 | 4 | 0.5 | 200 | 350 | 345 | 2.5 | 2027 | 353 | −6.94 | 7.38 |
| 28 | 2 | 0.5 | 200 | 350 | 179 | 2.5 | 1821 | 610 | −3.29 | 8.36 |
| 29 | 2 | 0.2 | 400 | 350 | 215 | 2.5 | 1672 | 467 | No Data | 11.60 |
| 30 | 4 | 0.2 | 200 | 350 | 589 | 2.5 | 1925 | 196 | −1.03 | 8.90 |
| 31 | 2 | 0.2 | 200 | 350 | 300 | 2 | 1038 | 208 | −9.65 | No Data |
| 32 | 2 | 0.2 | 200 | 350 | 300 | 2 | 1039 | 208 | −10.20 | No Data |
| 33 | 2 | 0.5 | 400 | 350 | 77 | 2 | 706 | 554 | −5.85 | No Data |
| 34 | 2 | 0.5 | 400 | 350 | 77 | 2 | 702 | 551 | −6.60 | No Data |
| 35 | 4 | 0.5 | 200 | 350 | 180 | 2 | 756 | 252 | −7.85 | No Data |
| 36 | 4 | 0.5 | 200 | 350 | 180 | 2 | 757 | 252 | −8.09 | No Data |
| 37 | 2 | 0.5 | 200 | 350 | 235 | 2 | 2245 | 573 | −4.19 | No Data |
| 38 | 2 | 0.5 | 200 | 350 | 235 | 2 | 2262 | 578 | −3.69 | No Data |
| 39 | 2 | 0.2 | 400 | 350 | 358 | 2 | 1864 | 313 | −11.4 | No Data |
| 40 | 2 | 0.2 | 400 | 350 | 358 | 2 | 1886 | 317 | No Data | No Data |
| 41 | 4 | 0.2 | 200 | 350 | 240 | 2 | 698 | 175 | −10.90 | No Data |
| 42 | 4 | 0.2 | 200 | 350 | 240 | 2 | 699 | 175 | −11.00 | No Data |

As seen from the data depicted in TABLE 1, it was possible to vary the parameters of the deposition process, within a temperature range that did not exceed 350° C. (the maximum temperature range for RF MEMS switches), to achieve deposition rates that varied from about 160 angstroms/min to about 1000 angstroms/min. The layer thickness of the silicon deposited varied from about 700 angstroms to greater than about 3500 angstroms, and the layers formed had low residual stress. These deposition rates and layer thicknesses are sufficient for a commercial MEMS fabrication process.

Figure 16:
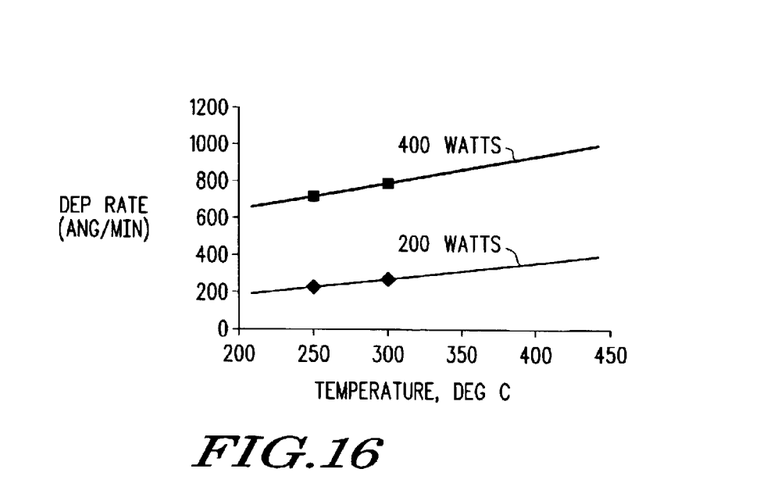
FIG. 16 is a graph of deposition rate as a function of temperature for PACVD of silicon at two different power settings.

Some trends are also discernible in the data of TABLE 1 in terms of the effect of temperature, pressure and RF power on deposition rate. To better illustrate these trends, selected data points from TABLE 1 are depicted graphically in FIGS. 16–17. Thus, FIG. 16 shows the deposition rate as a function of temperature (at a pressure of 2 Torr), and includes data points at an RF power of 200 watts and 400 watts. As indicated by FIG. 16, RF power was seen to have a significant effect on deposition rates, with a higher power resulting in a higher deposition rate at a given temperature. Temperature was seen to have a noticeable, though somewhat lesser, effect on deposition rate for a given RF power.

Figure 17:
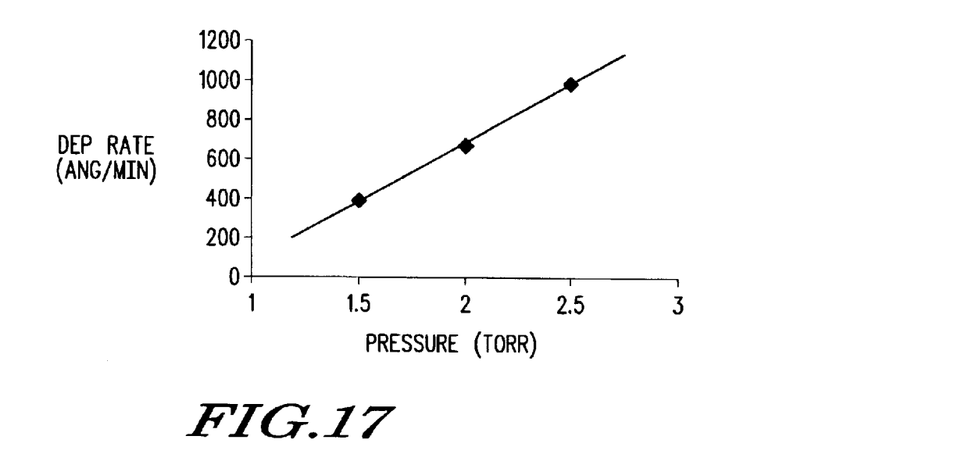
FIG. 17 is a graph of deposition rate as a function of pressure for PACVD of silicon.

FIG. 17 is a graph of deposition rate as a function of the pressure in the reaction chamber at a temperature of 350° C. As seen in this graph, deposition rates varied linearly with pressure over the ranges tested.

Referring again to the data of TABLE 1, the effective volume of Si—H bonds in the deposited layer suggests that the use of PACVD for silicon deposition using silane as a precursor leads to the formation of a layer of amorphous hydrogenated silicon. Amorphous hydrogenated silicon has material properties that are significantly better than those of pure amorphous silicon, due to the high defect density of the later compared to the former and the effect that those defects have in allowing trapped charge carriers to easily recombine. Hence, the use of PACVD in MEMS fabrication is seen to have benefits beyond those resulting from the low temperatures that the process affords.

These results indicate that PACVD can be used to deposit silicon at commercially feasible rates and layer thicknesses in a MEMS fabrication process. Moreover, the temperatures that the substrate is exposed to in this process are sufficiently low to allow its use in the fabrication of RF MEMS switches, or the fabrication of MEMS structures at any point in a conventional CMOS process, including the back end. Also, the physical properties of the silicon deposited by the PACVD process are superior, in terms of their electrical properties, to silicon layers produced by some other methods.

COMPARATIVE EXAMPLE 1

This example illustrates the thermal properties of a switch made with a solid gold top electrode.

A switch of the type depicted in FIG. 15, and made in accordance with the general methodology depicted in FIGS. 4–15, was fabricated, except that the top electrode was solid gold and had a thickness of 0.2 microns. The modulus and coefficient of thermal expansion of the Au electrode were determined (at a temperature within the range of 60–80° C.) and are set forth in TABLE 2.

EXAMPLES 43–45

The following examples illustrate the thermal stability of an RF MEMS made by way of PACVD.

In EXAMPLE 43, a switch was made as in COMPARATIVE EXAMPLE 1, except that the gold electrode was replaced with an undoped silicon electrode having a thickness of 0.3 microns. The modulus and coefficient of thermal expansion of the electrode were again determined and are set forth in TABLE 2.

In EXAMPLE 44, a switch was made as in COMPARATIVE EXAMPLE 1, except that the gold electrode was replaced with a silicon electrode having a thickness of 0.3 microns that was doped with boron. The modulus and coefficient of thermal expansion of the electrode were again determined and are set forth in TABLE 2.

In EXAMPLE 45, a switch was made as in COMPARATIVE EXAMPLE 1, except that the gold electrode was replaced with a silicon electrode having a thickness of 0.3 microns that was doped with phosphorous. The modulus and coefficient of thermal expansion of the electrode were again determined and are set forth in TABLE 2.

TABLE 2

Physical Properties of Top Electrode of Switches

| Example | Material of Upper Electrode | Modulus (GPa) | CTE (ppm/° C.) | Thickness (microns) |
| --- | --- | --- | --- | --- |
| COMPARATIVE EXAMPLE 1 | Au | 80 | 15 | 0.2 |
| EXAMPLE 43 | Undoped Silicon | 189–238 | 0.87 | 0.3 |
| EXAMPLE 44 | B-doped Silicon | 115–175 | 0.87 | 0.3 |
| EXAMPLE 45 | P-doped Silicon | 194–220 | 0.87 | 0.3 |

As the results of TABLE 2 indicate, the upper electrodes on the switches of EXAMPLES 43–45 had coefficients of thermal expansion that were much lower than the coefficient of thermal expansion of the Au electrode, thus demonstrating the improved thermal stability of the switches of EXAMPLES 43–45 compared to the switch of COMPARATIVE EXAMPLE 1. The upper electrodes on the switches of EXAMPLES 43–45 also had somewhat higher moduli, and therefore somewhat lower sensitivities, compared to the electrode of the switch of COMPARATIVE EXAMPLE 1. However, both of these parameters (modulus and sensitivity) were within acceptable ranges for most applications, nor was any attempt made to optimize these results.

Figure 18:
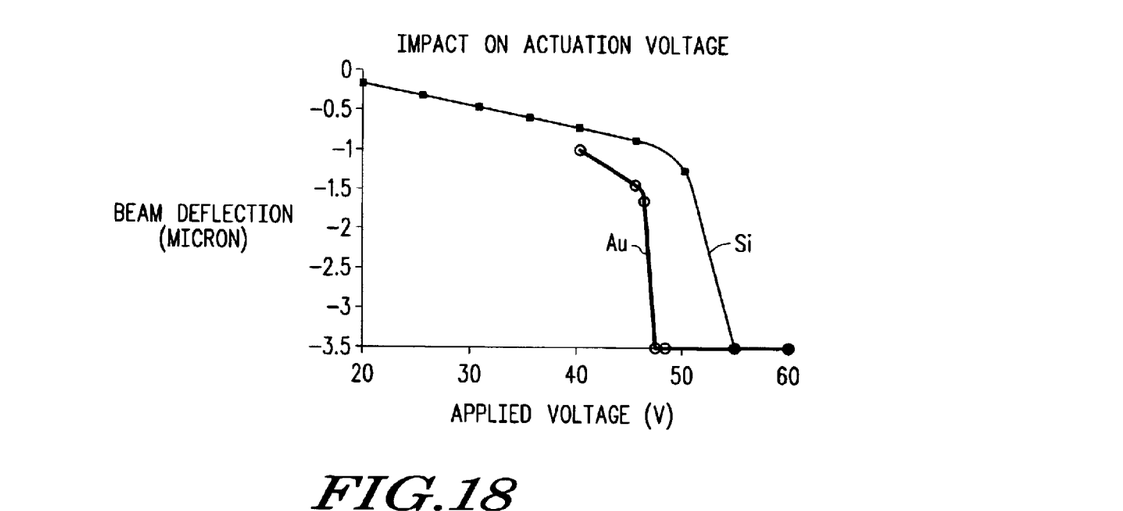
FIG. 18 is a graph of beam deflection as a function of applied voltage for MEMS having both Au and silicon electrodes.

FIG. 18 illustrates the effect on the actuation voltage when silicon is substituted for gold in a switch of the type depicted in FIG. 12. The beam deflection as a function of applied voltage was measured for the switches of COMPARATIVE EXAMPLE 1 and EXAMPLE 43. As shown therein, the actuation voltage (that is the voltage required for the signal line and the adjacent electrical contact to come into electrical contact with each other) for the switch of COMPARATIVE EXAMPLE 1 was about 46–48 V, compared with 50–55 V for the switch of EXAMPLE 43, thus demonstrating that a switch having an acceptable actuation voltage can be made based on silicon. The slight increase in actuation voltage is attributable at least in part to the higher modulus of silicon and the greater thickness of the silicon electrode of EXAMPLE 43 compared to the gold-based electrode of COMPARATIVE EXAMPLE 1.

A low temperature method for making MEMS devices out of silicon or silicon/germanium alloys has been provided herein, along with a method of fabricating MEMS structures based on these materials which can be integrated into the backend of a CMOS process, and which can be used to fabricate sensors and actuators. An RF MEMS device, and a method for making the same, have also been provided in which the CTE of the top electrode and cantilevered arm are closely matched such that the device exhibits substantially improved thermal stability compared to prior art devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a MEMS structure, comprising the steps of:
   providing a CMOS substrate having interconnect metal deposited thereon; and
   creating a MEMS structure on the substrate through the plasma assisted chemical vapor deposition of a material selected from the group consisting of silicon and silicon-germanium alloys.

2. The method of claim 1, wherein the MEMS structure is a sensor.

3. The method of claim 1, wherein the MEMS structure is an actuator.

4. The method of claim 1, wherein the interconnect metal comprises gold.

5. The method of claim 1, wherein the material is doped as it is deposited.

6. The method of claim 1, wherein the materiel is deposited at a temperature of less than about 450° C.

7. The method of claim 1, wherein the material is deposited at a temperature of less than about 350° C.

8. The method of claim 1, wherein the material is deposited at a temperature of less than about 300° C.

9. The method of claim 1, wherein the material is deposited at a temperature of less than about 250° C.

10. The method of claim 1, wherein the material comprises amorphous hydrogenated silicon.

11. The method of claim 1, wherein said CMOS substrate has at least a first surface region thereon comprising a first material selected from the group consisting of silicon, silicon oxide and gallium arsenide, and at least a second surface region thereon comprising a second material selected from the group consisting of silicon oxide and polyimide.

12. The method of claim 11, further comprising the steps of:
   forming a layer of a third material which extends over at least a portion of the first and second regions, wherein the third material is selected from the group consisting of silicon and silicon-germanium alloys, and wherein the layer of the third material is formed at a temperature of less than about 450° C. through a plasma assisted chemical vapor deposition process; and
   removing at least a portion of the second material from underneath the layer of the third material so as to form a micromechanical deflection element comprising the third material.

13. The method of claim 12, wherein the layer of the third material is formed at a temperature of less than about 400° C.

14. The method of claim 12, wherein the layer of the third material is formed at a temperature of less than about 350° C.

15. The method of claim 12, wherein the layer of the third material is formed at a temperature of less than about 300° C.

16. The method of claim 12, wherein the layer of the third material is formed at a temperature of less than about 250° C.

17. The method of claim 12, wherein the third material comprises silicon.

18. The method of claim 12, wherein the third material comprises germanium.

19. The method of claim 12, wherein the third layer is doped as it is formed.

20. The method of claim 19, wherein the dopant used to dope the third layer is boron or phosphorous.

21. The method of claim 12, wherein the micromechanical deflection element is a component of a sensor.

22. The method of claim 12, wherein the micromechanical deflection element is a component of an actuator.

23. The method of claim 12, wherein the third material comprises amorphous hydrogenated silicon.

24. The method of claim 1, wherein the CMOS substrate has circuitry defined thereon for supporting an RF MEMS switch, and wherein the step of creating a MEMS structure on the substrate comprises the steps of:
   applying a sacrificial layer to at least a portion of the substrate;
   forming a structural element of an RF MEMS switch that extends over at least a portion of the sacrificial layer;
   forming, through the use of a plasma assisted chemical vapor deposition process, an electrode on a surface of the structural element, the electrode comprising a material selected from the group consisting of silicon and silicon-germanium alloys; and
   removing at least a portion of the sacrificial layer from underneath the structural element so as to release the structural element.

25. The method of claim 24, wherein the structural element is formed by depositing and patterning a layer of SiON over the sacrificial layer.

26. The method of claim 24, wherein the sacrificial layer comprises a polyimide.

27. The method of claim 24, wherein the circuitry comprises gold.

28. The method of claim 24, wherein the structural element is formed at a temperature of less than about 350° C.

29. The method of claim 24, wherein the structural element is formed at a temperature of less than about 250° C.

30. The method of claim 24, wherein the material comprises amorphous hydrogenated silicon.

* * * * *